(12) United States Patent
Lin

(10) Patent No.: US 7,347,249 B2
(45) Date of Patent: Mar. 25, 2008

(54) FIXING DEVICE FOR A RADIATOR

(75) Inventor: Hsin-Cheng Lin, Taipei (TW)

(73) Assignee: Asia Vital Components Co., Ltd., Kaohsiung (TW)

( * ) Notice: Subject to any disclaimer, the term of this patent is extended or adjusted under 35 U.S.C. 154(b) by 275 days.

(21) Appl. No.: 11/182,926

(22) Filed: Jul. 18, 2005

(65) Prior Publication Data

US 2007/0012420 A1 Jan. 18, 2007

(51) Int. Cl.
*H05K 7/20* (2006.01)
(52) U.S. Cl. ............................ 165/80.2; 165/104.33; 257/718
(58) Field of Classification Search .............. 165/80.3, 165/104.33; 361/704, 710; 257/718, 719
See application file for complete search history.

(56) References Cited

U.S. PATENT DOCUMENTS

| 5,678,627 | A | * | 10/1997 | Lee | ............................ | 165/80.3 |
| 5,730,210 | A | * | 3/1998 | Kou | ............................ | 165/80.3 |
| 6,037,660 | A | * | 3/2000 | Liu | ............................ | 257/722 |
| 6,105,215 | A | * | 8/2000 | Lee | ............................ | 24/458 |
| 6,141,220 | A | * | 10/2000 | Lin | ............................ | 361/704 |
| 6,246,584 | B1 | * | 6/2001 | Lee et al. | ............................ | 361/704 |
| 2003/0159819 | A1 | * | 8/2003 | Lee | ............................ | 165/185 |
| 2003/0192672 | A1 | * | 10/2003 | Lee et al. | ............................ | 165/80.3 |
| 2005/0094377 | A1 | * | 5/2005 | Lee et al. | ............................ | 361/704 |

\* cited by examiner

*Primary Examiner*—Allen J. Flanigan

(57) ABSTRACT

A fixing device for a radiator provides a joining side projecting outward from a lateral side of each of the elastic strip members and has an engaging part at two inclining ends of the respective elastic strip member. The respective joining side is inserted into a locating groove at two lateral sides of the heat sink block of the radiator and the respective engaging part is fixedly attached to the circuit board by means of a fastening element.

1 Claim, 5 Drawing Sheets

US 7,347,249 B2

FIXING DEVICE FOR A RADIATOR

BACKGROUND OF THE INVENTION

1. Field of the Invention

The present invention is related to a radiator and particularly to a fixing device with elastic strip members for the central processing unit (CPU) being capable of being attached to the radiator firmly.

2. Brief Description of the Related Art

Referring to FIG. 1, the traditional fixing device for a radiator 12 mainly has a lock member 11 for being attached to the radiator 12. The lock member 11 presses the seat member 14 of the CPU. The radiator 12 has a groove 121 extending downward and the lock member 11 provides a press part 111 with a first locking part 112 and a second locking part 113 being disposed at two ends of the press part 111. The first locking parts 112 has a first joining hole 112a and the second locking part 113 has a second joining hole 113a respectively. The press part 111 of the lock member 11 is received in the groove 121. The seat member 14 of the CPU is provided with a first engaging part 141 and a second engaging part 142.

Referring to FIG. 2 in company with FIG. 1, when the fixing device is in use, the CPU 13 is placed on the seat member 14 and the radiator 12 is mounted to the seat member 14 to touch the CPU 13. Then, the press part 111 of the lock member 11 is joined to the bottom of the groove 121 with the first locking part 112 and the second locking part 113 engaging with the seat member 14 by means of the first engaging part 141 being hooked with the first joining hole 112a and the second engaging part 142 being hooked with the second joining hole 113a.

However, the preceding conventional fixing device has the following shortcomings:

(1) The radiator 12 has to provide the groove 121 in order to accommodate the lock member 11. However, the actual cooling area of the radiator 12 is reduced due to the lock member 11.

(2) Although the conventional fixing device provides the press part 111 to hold the radiator 12, it is incapable of avoiding the radiator 12 to displace relative to the seat member 14.

(3) The conventional fixing device is incapable of pressing the radiator 12 against the CPU 13 tightly in spite of the lock member having the first and second locking parts 112, 113 to be held with the first and second engaging parts 141, 142 of the seat member 14.

(4) The lock member 11 of the conventional fixing device is easy to hinder air flow induced by the fan.

SUMMARY OF THE INVENTION

In order to solve the preceding problems, an object of the present invention is to provide a fixing device, which is capable of enhancing effect of holding a radiator.

Another object of the present invention is to provide a fixing device, which is capable of allowing a radiator to touch the CPU tightly.

A further object of the present invention is to provide a fixing device with which it is not necessary to decrease the cooling area of a radiator.

A further object of the present invention is to provide a fixing device, which makes a radiator possible to connect with heat guiding pipes.

A further object of the present invention is to provide a fixing device, which is incapable of hindering air flow induced by a fan.

Accordingly, a fixing device for a radiator according to the present invention provides two opposite elastic strip members with a joining side extending outward from a lateral side of each of the elastic strip members and two inclining ends of the respective elastic strip member having an engaging part respectively. The joining side is inserted into two lower lateral sides of the radiator and the engaging part is fixedly attached to the circuit board by means of a fastening element.

BRIEF DESCRIPTION OF THE DRAWINGS

The detail structure, the applied principle, the function and the effectiveness of the present invention can be more fully understood with reference to the following description and accompanying drawings, in which.

DETAILED DESCRIPTION OF THE INVENTION

Figure 1:
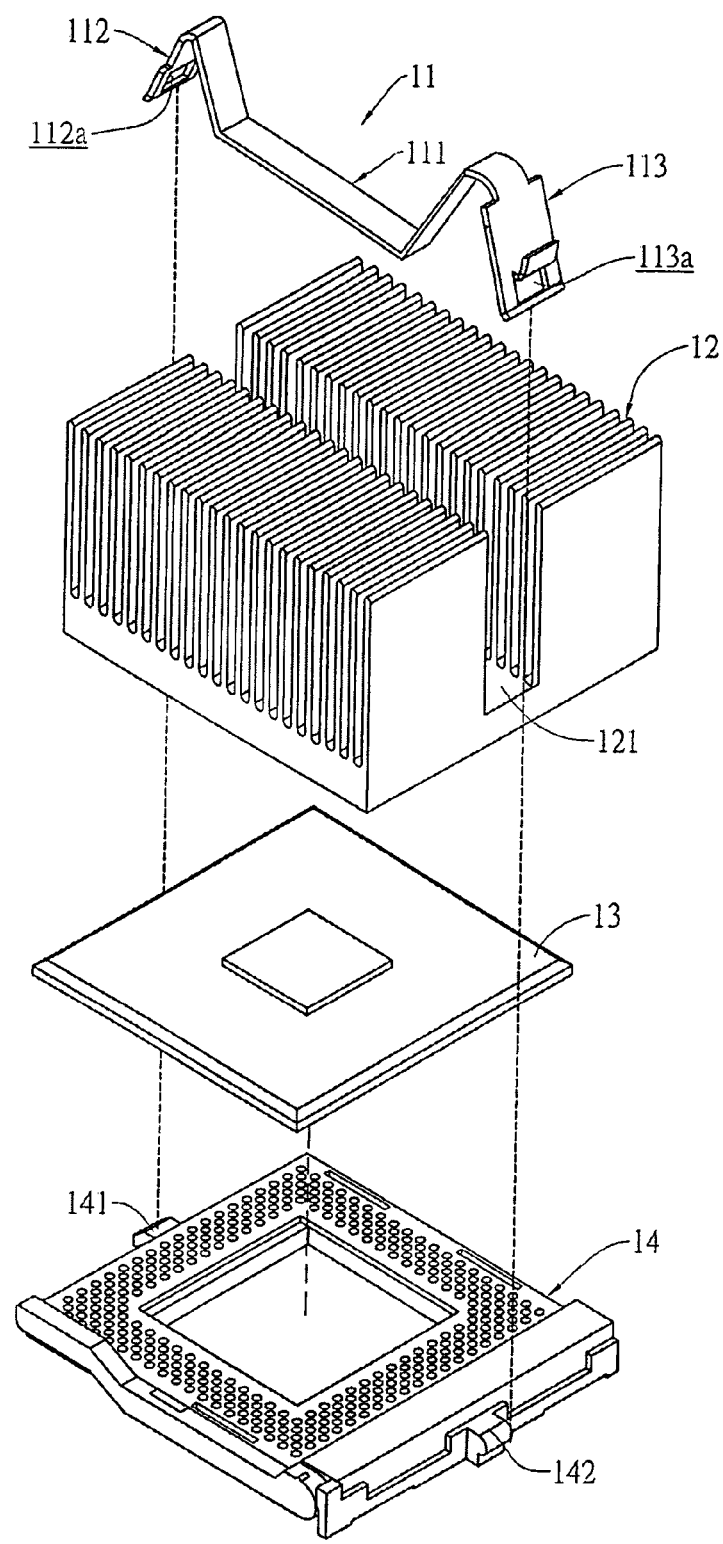
FIG. 1 is an exploded perspective view of the conventional fixing device for a radiator.
Figure 2:
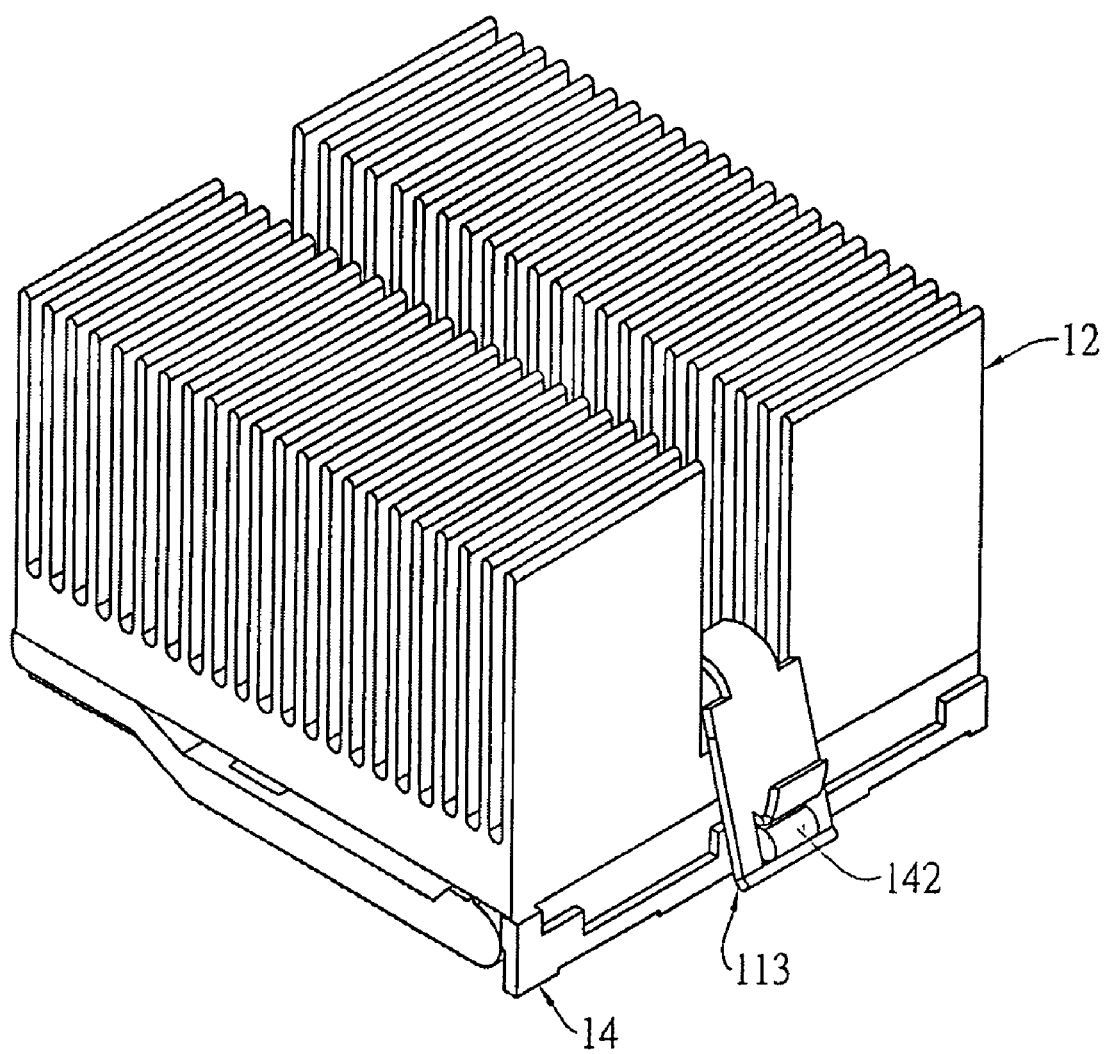
FIG. 2 is an assembled perspective view of the conventional fixing device shown in FIG. 1.
Figure 3:
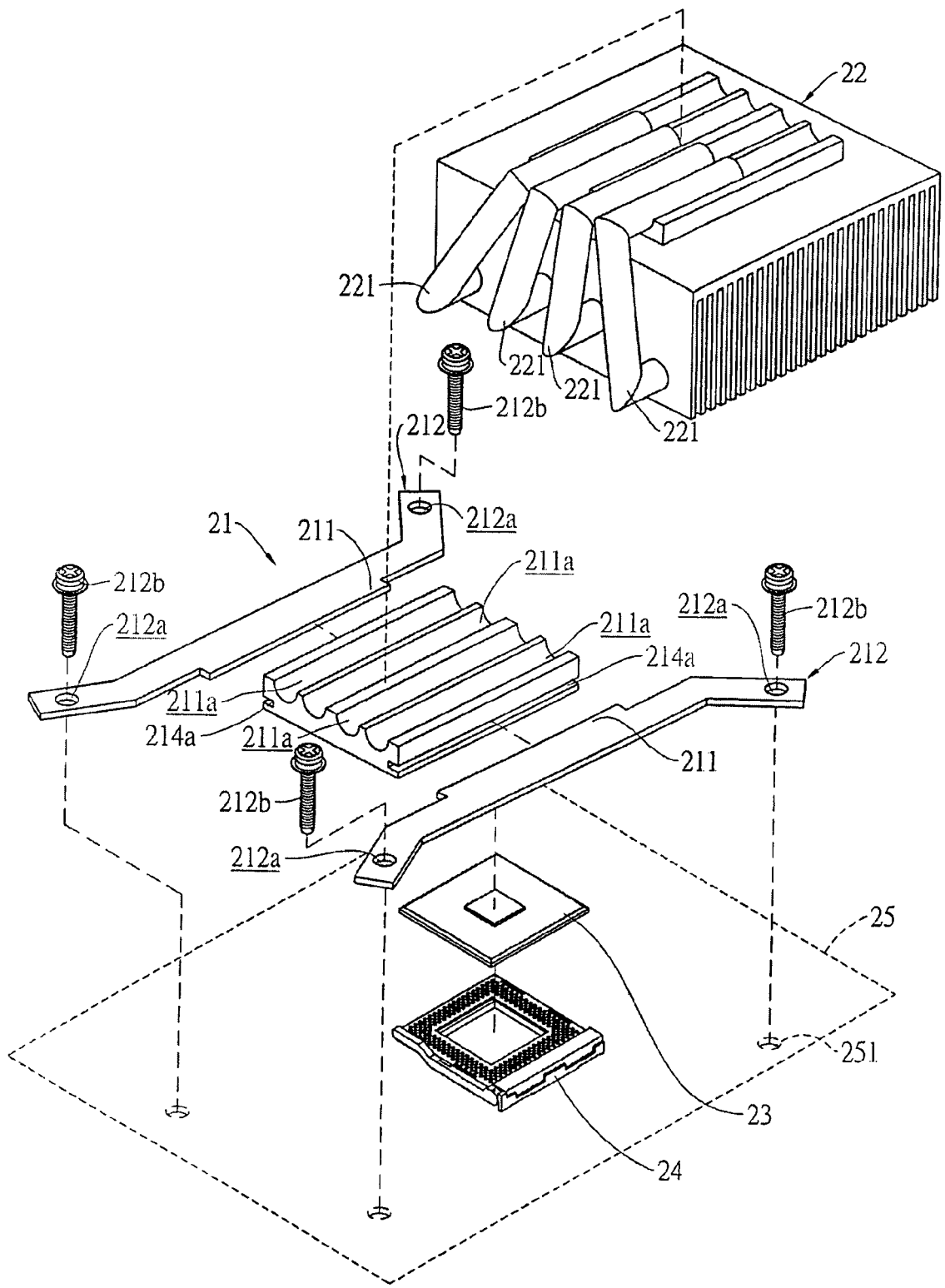
FIG. 3 is an exploded perspective view of the first embodiment of a fixing device for a radiator according to the present invention in operation.

Referring to FIG. 3, the first embodiment of a fixing device for a radiator according to the present invention provides two opposite elastic strip members 21 and each of the elastic strip members 21 has a joining side 211 and two engaging parts 212. The joining side 211 is an outward side protruding from the middle section of a lateral side of the respective elastic strip member 21 for inserting into an elongated locating groove 214a provided at two opposite lateral sides of a heat sink block of a radiator 22. The respective locating groove 214a has a space corresponding to the joining side 211. The heat sink block of the radiator 22 has a plurality of parallel elongated semicircular recesses 211a at the upper side thereof and each of the elongated semicircular recesses 211a receives a heat guiding pipe 221 respectively. The engaging parts 212 are disposed at two inclining end sections of the respective elastic strip member 21 and each have a through hole 212a corresponding to the through holes 251 of a circuit board 25 underneath and being available for a fastening element 212b, which is a screw fastener shown in FIG. 3, passing through and engaging with the circuit board 25.

Figure 4:
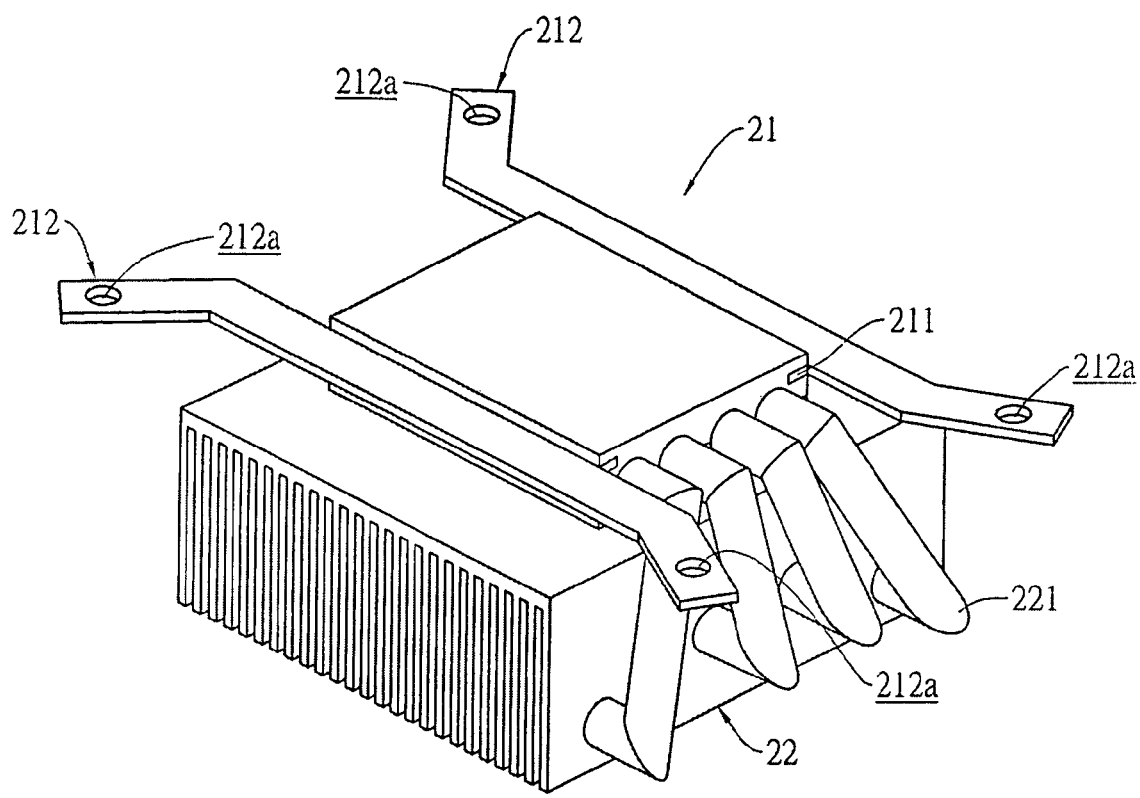
FIG. 4 is an assembled perspective view of the first embodiment of a fixing device for a radiator according to the present invention shown in FIG. 3 while being projected from the bottom side thereof.
Figure 5:
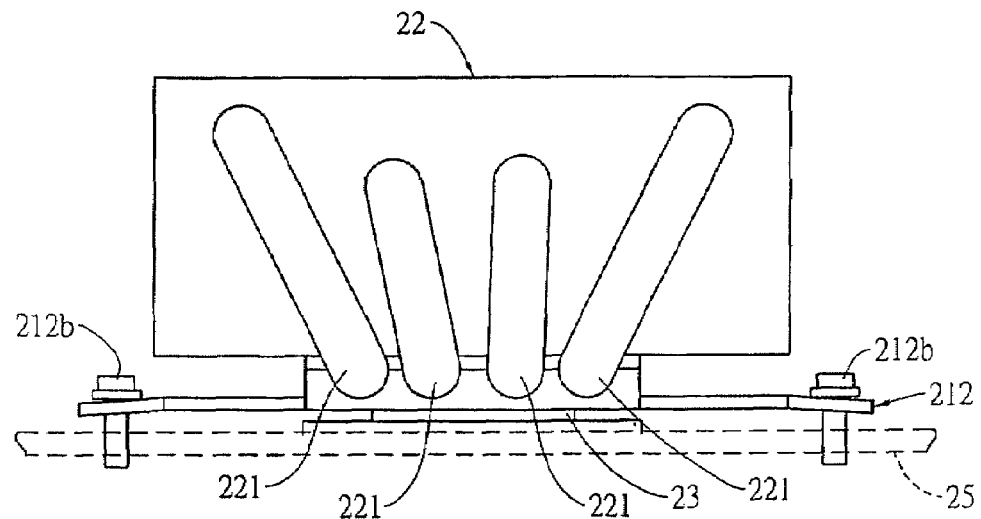
FIG. 5 is a side view of the first embodiment of a fixing device for a radiator according to the present invention.

Referring to FIGS. 4 and 5 in company with FIG. 3, when the fixing device of the present invention is in use, a CPU (Central Processing Unit) 23 is mounted to a seat member 24 on the circuit board 25 and the joining side 211 is inserted into the corresponding locating groove 214a respectively. Then, the engaging parts 212 engage with the circuit 25 by means of the fastening element 212b passing through the through holes 212a, 251 and fastening to the circuit board 25.

Figure 6:
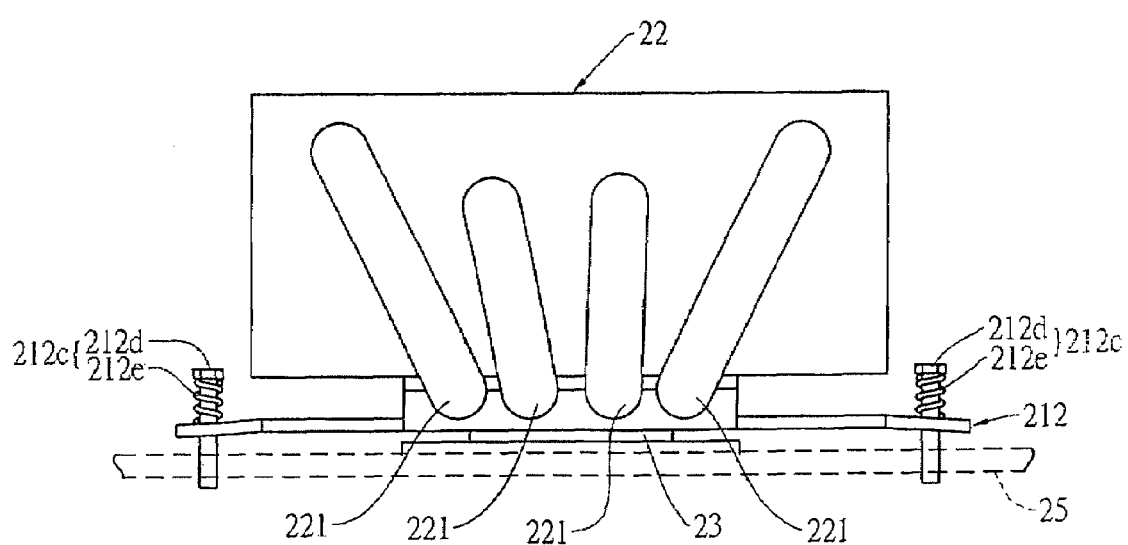
FIG. 6 is a side view of the second embodiment of a fixing device for a radiator according to the present invention.

Referring to FIG. 6, the second embodiment of the present invention is illustrated. The difference of the second embodiment from the first embodiment is in that the fastening element 212c is used to engage with the engaging parts 212 and the circuit board 25 respectively with the fastening element 212c having an elastic part 212e with an enlarged head 212d for the engaging parts 212 being capable of allowing the heat sink block of the radiator 12 being joined to the CPU 23 more tightly.

It is appreciated that, comparing to the prior art, the fixing device for a radiator according to the present invention has the following advantages and effectiveness:

(1) The joining side 211 provided at the elastic strip member 21 being inserted into the locating groove 214a offers better effect for firmly holding the radiator 12 than the prior art.

(2) More than one engaging part 212 being provided at the respective elastic strip member 21 are capable of being fixedly attached to the circuit board 25 and allow the radiator 12 to touch the CPU 23 tightly for enhancing heat dissipation.

(3) The elastic strip member 21 is mounted to the heat sink block, which is disposed at the lower part of the radiator 22 so that air flow from a fan is incapable of being impeded during moving into the radiator 22.

(4) The elastic strip member 21 provides much better elastic effect due to only the respective joining side 211 being inserted into the corresponding locating groove 214a.

While the invention has been described with referencing to preferred embodiments thereof, it is to be understood that modifications or variations may be easily made without departing from the spirit of this invention, which is defined by the appended claims.

What is claimed is:

1. A radiator comprising:
a heat sink block providing a plurality of parallel semi-circular recesses at a first facial side thereof for receiving a heat guiding pipe respectively; and
a fixing device being joined to said heat block for engaging with a circuit board, which has a seat member with a central processing unit (CPU) on said seat member and a plurality of first through holes, such that a second facial side, which is disposed on said heat block opposite to said first side, is capable of touching the CPU tightly;
wherein said heat sink block further provides an elongated locating groove at two opposite lateral sides thereof; and said fixing device further comprises two opposite elastic strip members with a joining side protruding outward from a lateral side of each of said elastic strip members for being inserted into the respective locating groove and both ends of the respective elastic strip members having an inclining engaging part with a second through hole corresponding to said first through holes for engaging with said circuit board in a way of said CPU is tightly touch with said second facial side for enhancing heat dissipation.

* * * * *